United States Patent [19]

Seymour et al.

[11] Patent Number: 5,047,829
[45] Date of Patent: Sep. 10, 1991

[54] MONOLITHIC P-I-N DIODE LIMITER

[75] Inventors: David J. Seymour, Plano; David D. Heston, Dallas; Randall E. Lehmann, Garland, all of Tex.

[73] Assignee: Texas Instruments Incorporated, Dallas, Tex.

[21] Appl. No.: 924,948

[22] Filed: Oct. 30, 1986

[51] Int. Cl.⁵ .............................................. H01L 29/12
[52] U.S. Cl. ........................................ 357/58; 357/74; 357/55; 333/17.20; 333/247
[58] Field of Search ............................ 357/58, 74, 55; 333/246, 247, 248, 17.1, 17.2, 17.3

[56] References Cited

U.S. PATENT DOCUMENTS

| | | | |
|---|---|---|---|
| 2,863,126 | 12/1958 | Pierce | 333/248 X |
| 3,445,793 | 5/1969 | Biard | 357/58 X |
| 3,538,465 | 11/1970 | Manning, Jr. et al. | 333/246 |
| 3,560,891 | 2/1971 | MacLeay et al. | 357/14 X |
| 3,580,886 | 2/1971 | Cooper et al. | 357/14 X |
| 3,593,207 | 7/1971 | Woermbke | 357/17 L X |
| 3,715,689 | 2/1973 | Laughlin | 333/246 X |
| 3,959,794 | 5/1976 | Chrepta et al. | 358/58 X |
| 4,267,538 | 5/1981 | Assal et al. | 333/262 |
| 4,276,558 | 6/1981 | Ho et al. | 357/74 X |
| 4,571,559 | 2/1986 | Henry et al. | 357/58 X |

OTHER PUBLICATIONS

Toyoda et al., "GaAs Varactor Diode for VHF TV Tuners", *National Technical Report*, vol. 22, No. 1, Feb. 1976, pp. 75–80.

*Primary Examiner*—William Mintel
*Attorney, Agent, or Firm*—Melvin Sharp; James T. Comfort; N. Rhys Merrett

[57] ABSTRACT

Monolithic gallium arsenide limiters (30) formed of p-i-n diodes (32, 34) that are distributed devices between conductors of coplanar waveguide sections (40, 42, 44) are disclosed. The diode doped regions underlie the coplanar conductors and the diode intrinsic region underlies the coplanar waveguide gap. The grounded coplanar segments connect to a backside ground through vias (74).

9 Claims, 8 Drawing Sheets

SILICON PIN DIODE LIMITER IN A
HYBRID MICROWAVE CIRCUIT

MICROWAVE DIODE LIMITER: (A) STRIPLINE
CROSS SECTION; (B) EQUIVALENT CIRCUIT.

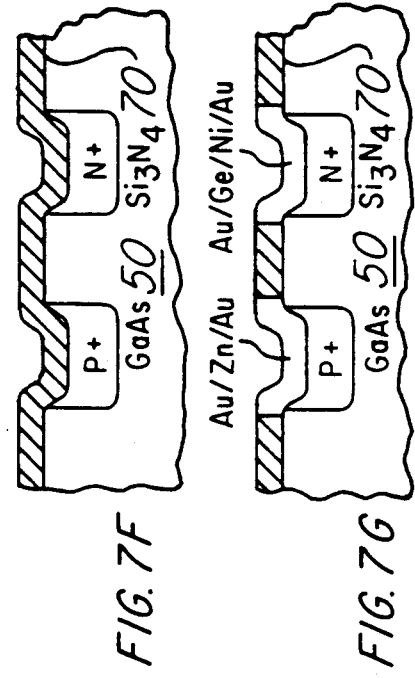
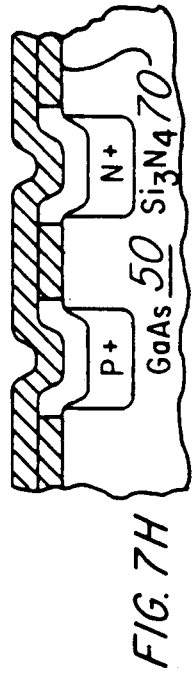
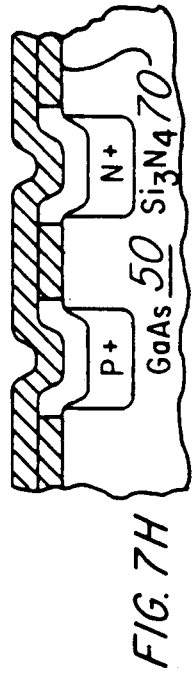
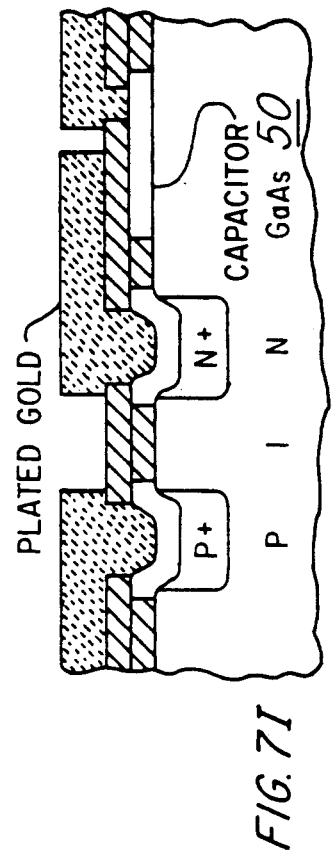
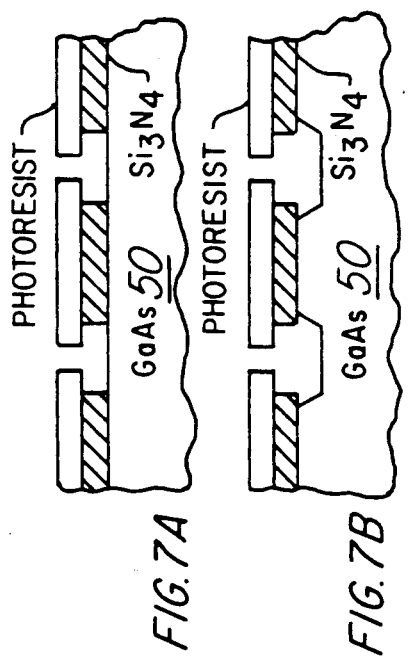
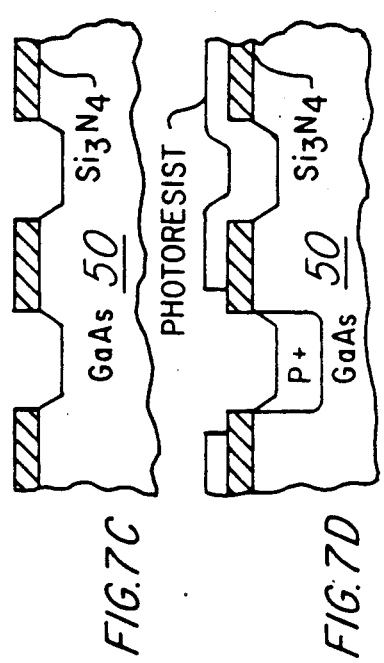
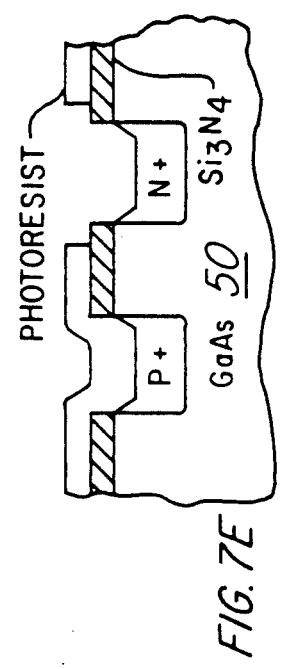

MONOLITHIC P-I-N DIODE LIMITER

BACKGROUND OF THE INVENTION

1. Field of the Invention

The present invention relates to semiconductor electronic devices, and, more particularly, to diode limiters.

2. Description of the Related Art

Microwave limiters are typically used in a microwave receiver as passive protection devices and are placed between an antenna and a mixer or low noise amplifier (LNA) to protect the mixer or LNA from burnout due to excessively large rf input to the antenna. The essential features of a limiter are small insertion loss at small-signal input levels to preserve the receiver noise figure and large insertion loss at large-signal input levels to protect the mixer or LNA. Conventional radar receivers use hybrid silicon p-i-n diode limiters in a passive mode; and to meet the required limiting and insertion loss specifications the hybrid silicon p-i-n diode chips used in these limiters are extremely small making them difficult to bond into circuits. The parasitic bond wire inductances used to bond the diodes into the circuit reduce the bandwidth over which the limiter maintains an acceptable small-signal match; see FIG. 1 for a schematic illustration of a silicon diode bonded into a hybrid microwave circuit. Note that silicon has inherently longer carrier storage times than gallium arsenide and, consequently, silicon p-i-n diodes have a lower on-resistance; but silicon is not appropriate material for monolithic microwave circuits due to high substrate losses and inability to incorporate into monolithic circuits.

More generally, the noise figure (NF) and gain requirements of galium arsenide LNAs are increasing in both military and commercial devices, and these requirements are usually met with ever decreasing MESFET gate lengths. However, decreasing gate length implies increasing sensitivity to electrostatic discharge and burnout. Thus a passive silicon diode limiter at the input of a LNA is typically used; but again the small size of silicon p-i-n diode chips makes for difficult bonding into hybrid microwave circuits and low yield for the hybrid device.

Thus known limiters have problems including lack of broadband small-signal match and low yield of hybrid devices.

SUMMARY OF THE INVENTION

The invention provides a monolithic broadband p-i-n diode limiter by distributing a p-i-n diode in the gap of a short section of grounded coplanar waveguide. Preferred embodiments fabricated in GaAs have demonstrated 7 dB of limiting with a +30 dBm input signal while maintaining less than 0.25 dB of small signal insertion loss from 1 GHz to 12 GHz.

This solves the problems of the known limiters with the advantages of monolithic fabrication in GaAs or other semiconductor material, distribution of the diode in a coplanar waveguide or microstrip format, and complementary polarity diodes for full wave current injection which eliminates the need for a dc return path.

BRIEF DESCRIPTION OF THE DRAWINGS

The drawings are schematic for clarity.

FIG. 7 illustrate a first preferred embodiment method of fabrication of the diode limiter.

DESCRIPTION OF THE PREFERRED EMBODIMENTS

Figure 1:
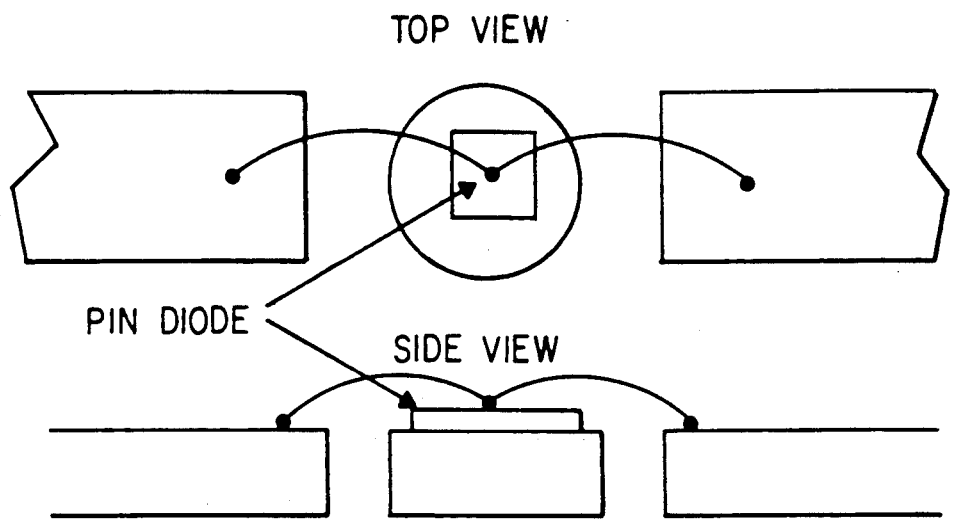
FIG. 1 is a schematic illustration of a known silicon hybrid p-i-n diode limiter bonded into a hybrid microwave circuit.
Figure 3A:
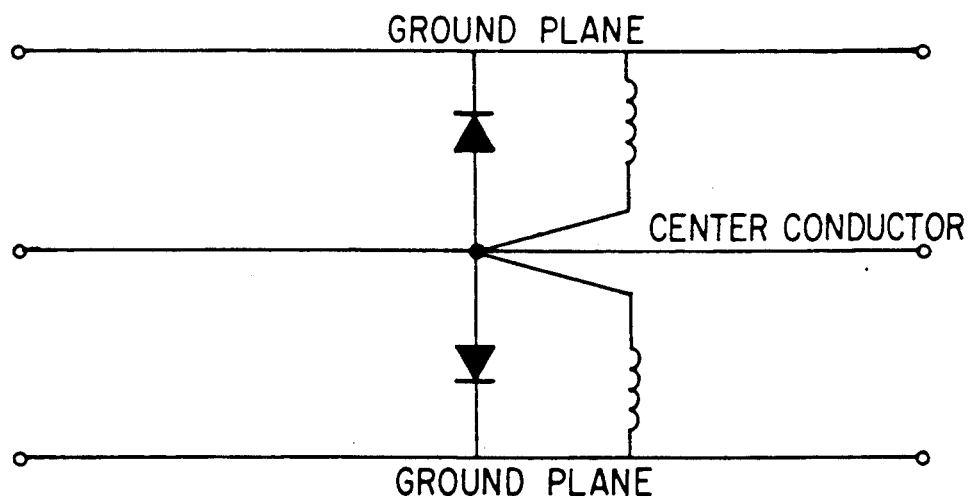
FIGS. 3A-B illustrate connection of a limiter in a stripline.
Figure 3B:
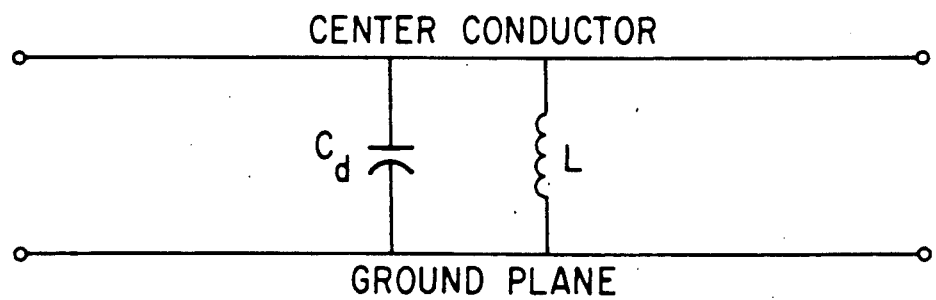
Figure 2:
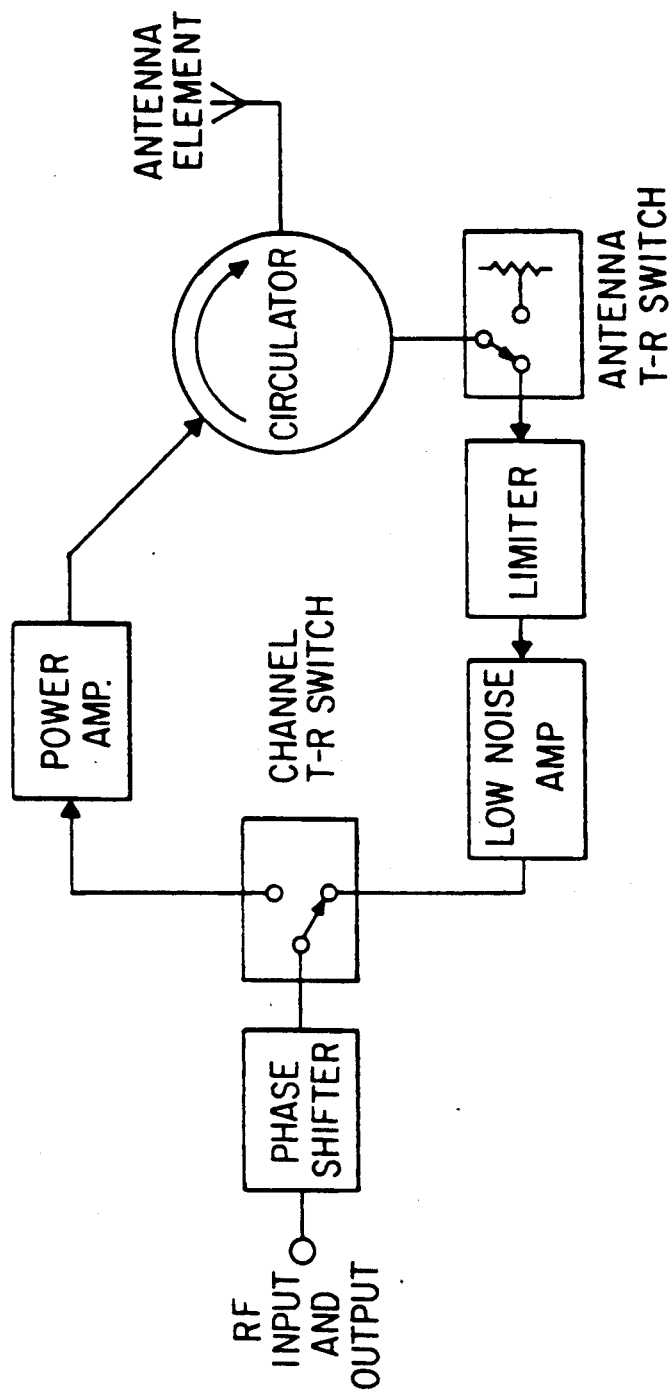
FIG. 2 is a schematic illustration of a transmit-receive system including a limiter.

FIG. 2 schmatically illustrates a typical transmit-receive system block diagram with the limiter shown between the antenna and the low noise amplifier (LNA); and FIGS. 3A-B schematically illustrates the typical connection of a diode limiter in a stripline transmission line and the equivalent circuit. In particular, FIG. 3A shows two diodes shunted across a balanced stripline transmission line together with a shunting inductive stub. The inductive stub provides a dc return for the diodes. For small-signal levels (peak rf voltage less than the diode knee) the equivalent circuit is shown in FIG. 3B where Cd represent the zero-bias depletion capacitance of the diodes and L represents the inductance of the stub. Adjustment of L by stub length adjustment permits parallel resonance of the diode capacitance at a desired center frequency and thus a very high impedance in shunt (low insertion loss) in a band about this frequency for small-signals. Conversely, a large-signal level (rf voltages peaking above the diode knee) implies appreciable injection of minority carriers which causes modulation of the i region conductivity. The conduction of the i region increases by orders of magnitude and effectively shorts the transmission line and yields a large insertion loss.

Figure 4A:
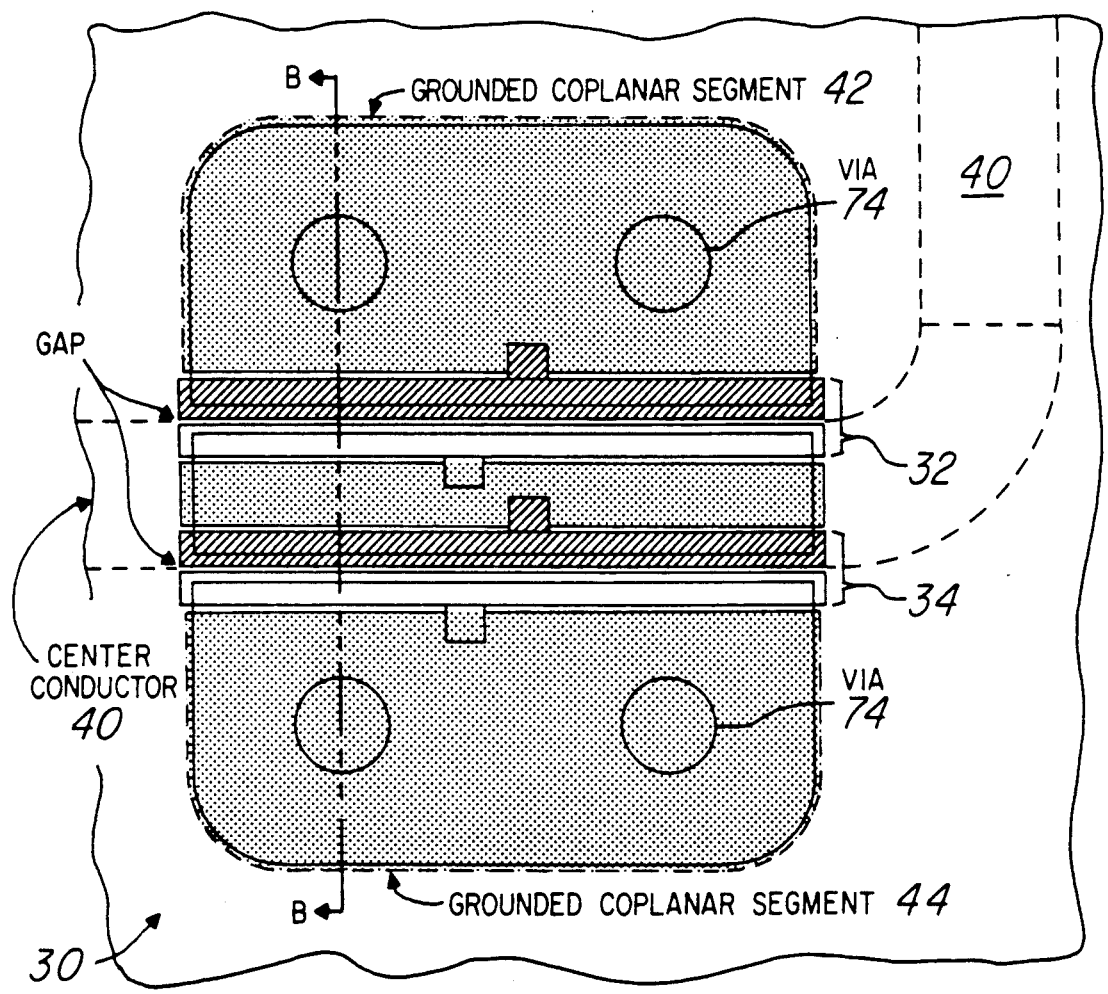
FIGS. 4A-B are plan and cross sectional elevation views of a first preferred diode limiter.
Figure 4B:
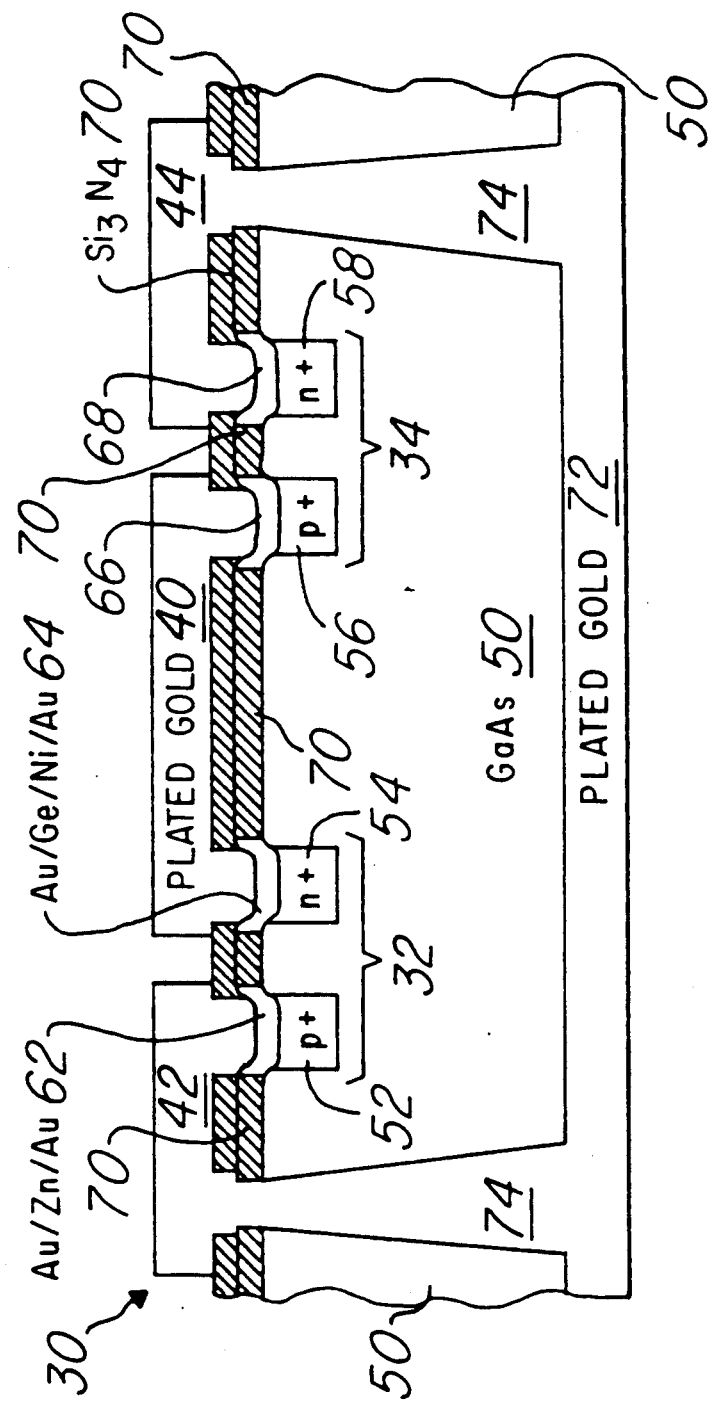

A first preferred embodiment monolithic GaAs p-i-n diode limiter, generally denoted 30, is schematically illustrated in plan and cross sectional elevation views in FIGS. 4A-B and includes two lateral p-i-n diodes 32 and 34 between center conductor 40 of a short section of coplanar waveguide and its grounded coplanar segments 42 and 44, the coplanar waveguide section being on the surface of undoped GaAs substrate 50. Diode 32 is formed by implanted p+ region 52 and implanted n+ region 54 in substrate 50 together with the portion of substrate 50 between regions 52 and 54 as the intrinsic region; similarly, diode 34 is formed by p+ region 56, n+ region 58, and the undoped region between. Diode 32 has gold/zinc/gold contact 62 for ohmic contact to p+ region 52 and gold/germanium/nickel/gold contact 64 for ohmic contact to n+ region 54; similarly, diode 34 has contacts 66 and 68. Silicon nitride 70 provides the insulation and is shown as shaded in FIG. 4B which is the cross sectional elevation view along line B—B of FIG. 4A. Substrate 50 is backside plated with gold 72 to provide a ground, and gold-filled vias 74 connect ground 72 to coplanar segments 42 and 44.

The dimensions of limiter 30 are as follows: width of diodes 32 and 34 (horizontal distance in FIG. 4A) is 300 μm and the length of the intrinsic region (distance between the p+ and n+ regions in each diode and labelled "gap" in FIG. 4A) is 5 $\mu$m; doped regions 52, 54, 56, and 58 are about 0.5 $\mu$m deep; center conductor 40 has width 110 $\mu$m which means the characteristic impedance of the microstrip transmission line formed by conductor 40 over ground 72 away from the coplanar waveguide section (upper righthand corner of FIG. 4A) will be about 50 $\Omega$ for substrate 50 of thickness about 150 $\mu$m; and nitride layer 70 is made of two sublayers of thicknesses 3,000 and 2,000 Å. Substrate 50 is nominally undoped but residual impurities such as carbon lead to a p$^-$ doping of typically $10^{14}$/cm$^3$.

The opposite polarities of diodes 32 and 34 (the p+ terminal is grounded in diode 32 and the n+ terminal in diode 34) implies that both positive and negative peaks of a waveform inject carriers and that a dc return path is automatically provided which increases bandwidth over a single polarity limiter with an additional dc return path incorporated.

Figure 5A:
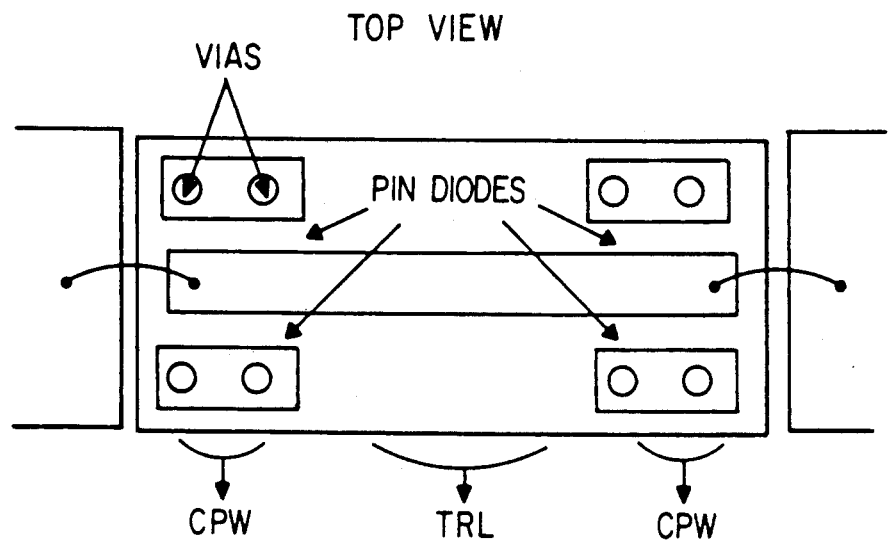
FIGS. 5A-B and 6 illustrate alternative connections for the first preferred embodiment.
Figure 5B:
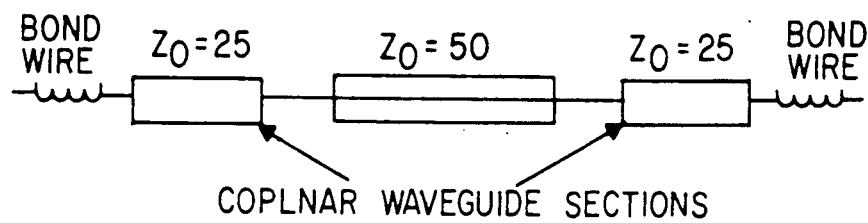
Figure 6:
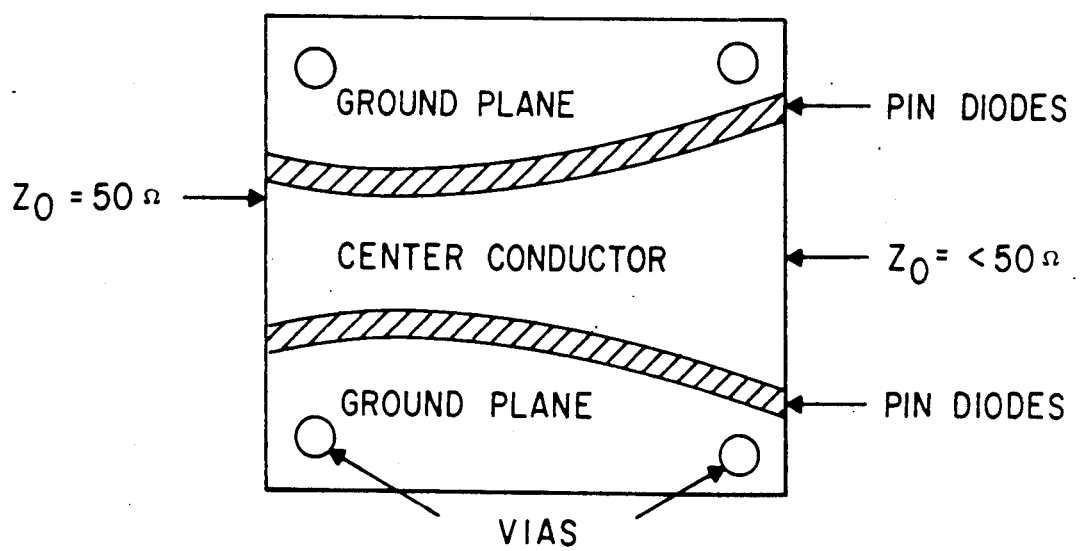

From a circuit standpoint one can design and fabricate a GaAs monolithic microwave integrated circuit (MMIC) with monolithic GaAs p-i-n diodes shunted across a transmission line in the same hybrid circuit configuration as with silicon diodes as in FIG. 2A. However, the lumped capacitance of a monolithic GaAs diode would have to be accounted for in the insertion loss in the same manner as the capacitance of a silicon diode in a hybrid circuit, but a GaAs diode exhibits a higher resistance per unit area than a silicon diode due to the shorter minority carrier storage time in the GaAs diode. Therefore, a larger GaAs diode is required and this implies a larger lumped capacitance. But with limiter 30 the capacitance of diodes 32 and 34 is absorbed into the characteristic impedance of the coplanar waveguide section; and the section can be used as a matching element (see FIGS. 5A-B) or be tapered in impedance to optimize the insertion loss and limiting performance (see FIG. 6). The limiting capability may be increased by lengthening the coplanar waveguide section; but it is more effective to split the coplanar waveguide into two sections and separate the two sections with a quarter-wavelength (at the principal frequency of interest) section of microstrip transmission line as shown in FIGS. 5A-B. This provides an approximately 6 dB of additional limiting.

The surface-oriented diode fabricated on a semi-insulating GaAs substrate allows easy integration into MMICs and is potentially compatible with MESFET circuits. The semi-insulating substrate serves as the insulating layer (i region) of the p-i-n diode. Further features of limiter 30 and its diodes can be seen from the following description of a first preferred embodiment method of fabrication:

For clarity the fabrication method for only a single p-i-n diode is described and illustrated in FIGS. 7A-I. The method begins with deposition and patterning of silicon nitride on the undoped GaAs substrate 50 (FIG. 7A). This pattern defines both the p+ and n+ regions of the p-i-n diode. This results in self-alignment of the p+ and n+ regions for excellent control of the width of the i region. A trench is etched in the GaAs to a depth of 1 $\mu$m (FIG. 7B). The trench allows the sidewalls of the p+ and n+ regions to have larger areas, resulting in higher carrier injection. This reduces the series resistance by a factor of three. The resist is removed (FIG. 7C) and another resist layer is applied and patterned (FIG. 7D). This resist acts as a mask for the Be implant in the n+ region. The nitride serves as the implant mask of the Be into the p+ region. The self-alignment of the implant to the trench insures good control of the p-i-n diode spacing. The resist is removed and the previous step is repeated for the Si implant (FIG. 7E). The Si implant is the same as for a low-noise MESFET, which implies compatibility with the integration of low-noise MESFETs on the same substrate. After both implants are completed, the resist and nitride are removed. The slice is annealed using an undoped cover in a proximity anneal for 15 minutes at 850° C. After anneal, the GaAs substrate is covered with 3,000 Å of silicon nitride 70 (FIG. 7F). The contact metals for the p+ is 3,000 Å of Au/Zn/Au and for the n+ is 3,000 Å of AuGe/Ni/Au. After nitride 70 is patterned and etched, the contact metals are deposited and lifted off (FIG. 7G) and alloyed. Then 2,000 Å of nitride 70 (second sublayer) is deposited. This nitride serves as the dielectric for capacitors and circuit crossovers (FIG. 7H). The last step is the deposition of the top metal layer to form interconnects and transmission lines (FIG. 7I).

Figure 8:
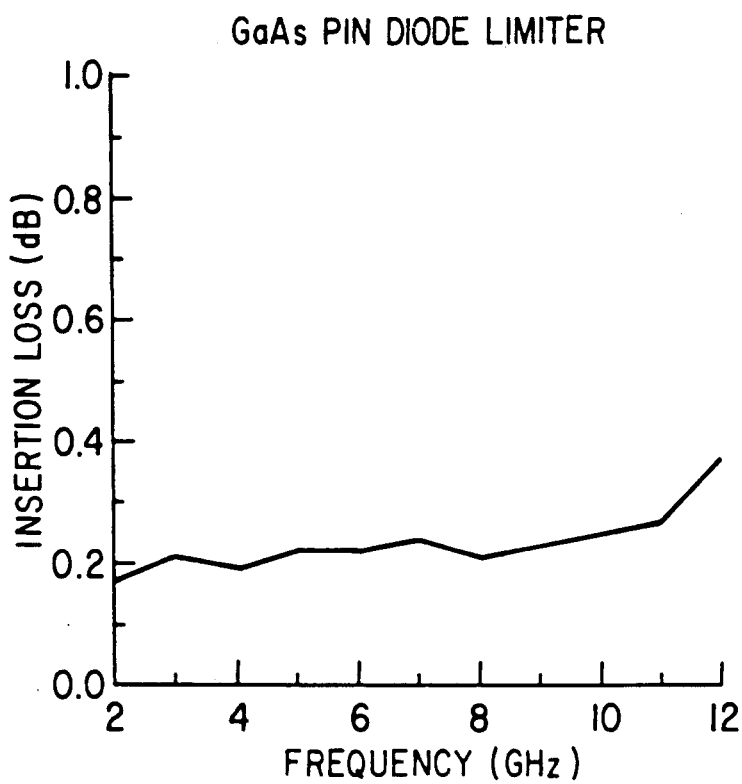
FIGS. 8-12 show the electrical properties of the first preferred embodiment.
Figure 9:
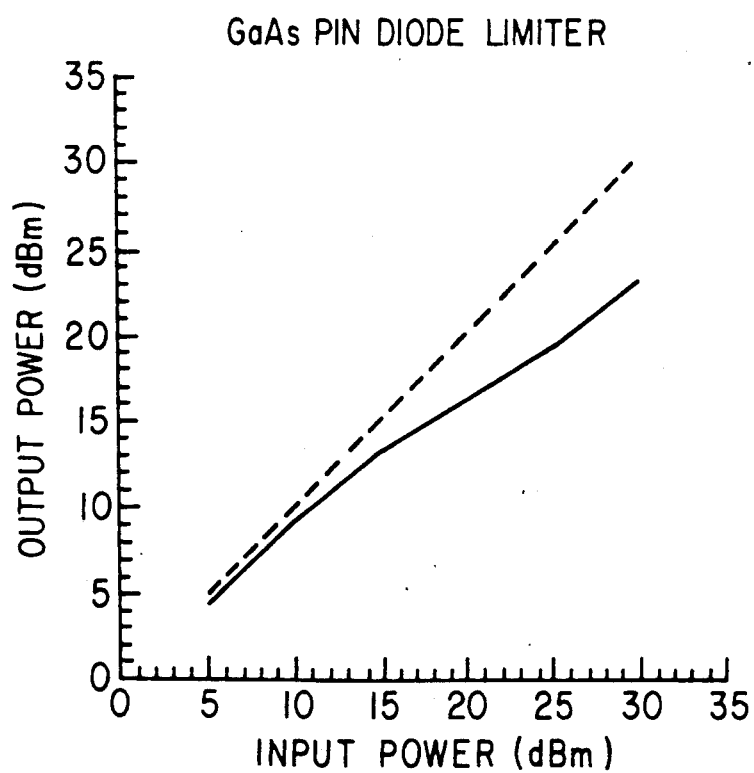
Figure 10:
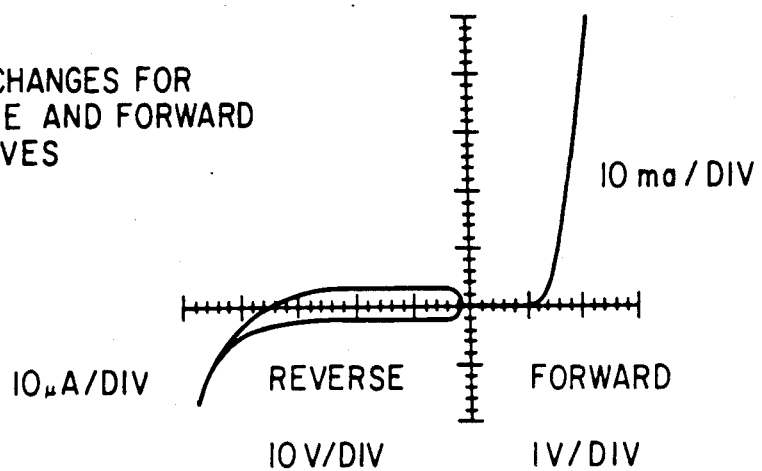
Figure 11:
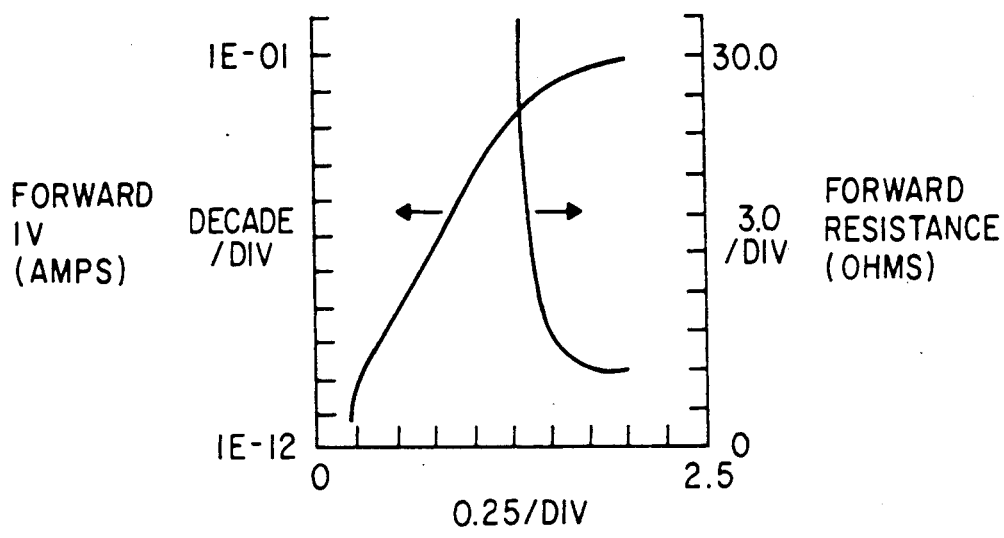
Figure 12:
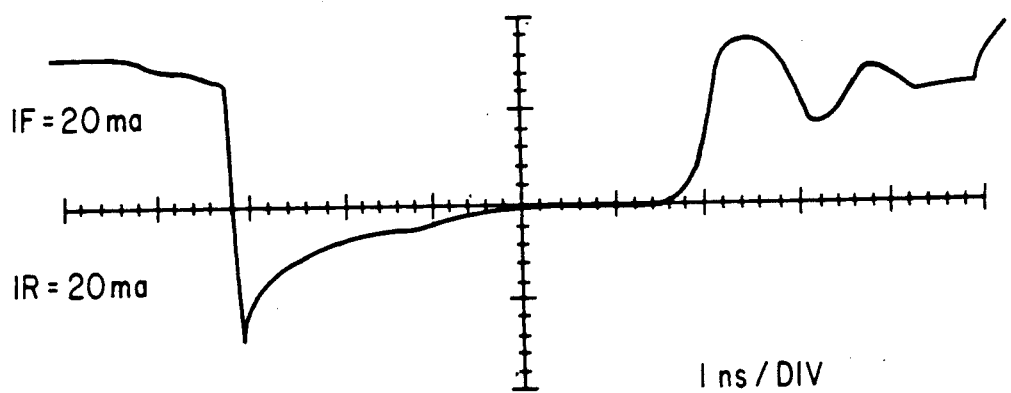

FIGS. 8-12 illustrate the electrical properties of limiter 30; FIGS. 8 and 9 illustrate a combination of microstrip and coplanar waveguide achieves less than 0.25 dB small signal insertion loss and greater than 7 dB limiting at 10 GHz. The voltage-current characteristic of a single p-i-n diode with a 5-$\mu$m gap and 110-$\mu$m width is shown in FIG. 10. The breakdown voltage is in excess of 40 volts at 10 $\mu$A. A more detailed plot of the forward characteristics is shown in FIG. 11. The saturation current is approximately 1 pA. The ideality factor is slightly over 2, which is typical for this type of diode. The parasitic resistance is approximately 6 ohms. The storage time (FIG. 12) measured with a 50-ps rise-time is approximately 2 ns; this places the lower frequency limit at 80 MHz.

A section of coplanar waveguide is shown in FIG. 4A. The impedance of the coplanar waveguide is determined by two major parameters, the width of center conductor 40 and the "gap" spacing between center conductor 40 and coplanar segments 42 and 44. The coplanar segments are grounded by vias to the backside or by bondwires over the edge of the chip to ground. With a 4.4 mil wide center conductor, the grounded coplanar waveguide can be embedded directly into a 50 ohm line (6 mil substrate), and modeling indicates that a 12 mil section of grounded coplanar waveguide with a 5 $\mu$m gap would achieve less than a 1.25:1 VSWR through X-Band. The center conductor can serve as a contact to one side of the p-i-n diodes and the two coplanar segments each contact another side of one of the p-i-n diodes. The gap between the center conductor and the coplanar segments is the i region of the p-i-n diode.

A second preferred embodiment of the distributed diode 30 is its use as a shunt switch. Rather than dc ground coplanar segments 42 and 44, the segments are only rf grounded by a large capacitor and a dc bias is applied to the segments. If the diode is forward biased, then it acts as an rf short to ground, and if it is reversed biased, then it acts as an open circuit. Thus a pair of diodes can form a single-pole, double-throw switch.

MODIFICATIONS AND ADVANTAGES

Various modifications of the preferred embodiment devices and methods may be made while retaining the features of a distributed diode limiter. For example, the dimensions and shapes of the elements may be varied, such as the width, length, gap, thickness, and curvature of the substrate, surface conductors, doped regions, nitride insulator, metal contacts and interconnects. The materials and doping levels may be varied, such as $Al_xGa_{1-x}As$ substrate with zinc and sulfur dopants. The p-i-n diode could be replaced by a p-$\pi$-n or p-$\nu$-n diode by very light doping of the semiconductor in the gap.

The transmission lines and matching configurations may be varied, such as the coplanar segment with the distributed diodes could be connected to a coplanar waveguide, the diodes could be between the conductors of a slot line and the characteristic impedances could be modified to match the input of the LNA for minimum noise figure and thus simplify the matching circuitry between the limiter and the LNA.

The distributed diode has advantages including monolithic fabrication in coplanar waveguide and microstrip format and compatability with MESFET fabrication, simplicity of connections compared to hybrid systems, minimization of parasitic reactances and broadband response and absorption of the diode capacitance into the transmission line impedance, and the ability for impedance matching by varying diode geometry.

What is claimed is:

1. A distributed diode limiter, comprising:
   (a) first and second conductors on a surface of a semiconductor substrate, said conductors forming a planar transmission line on said surface with said second conductor grounded;
   (b) a first region in said semiconductor substrate at said surface and along and electrically contacting said first conductor, said first region doped a first conductivity type; and
   (c) a second region in said semiconductor substrate at said surface and along and electrically contacting said second conductor, said second region doped a second conductivity type opposite said first type, said first region and said second region separated by an undoped region to form a first distributed p-i-n diode.

2. The limiter of claim 1, wherein:
   (a) said semiconductor substrate is made of gallium arsenide; and
   (b) said first conductor connects to the conducting line of a microstrip transmission line.

3. The limiter of claim 1, further comprising:
   (a) a third conductor on said surface, said three conductors forming a section of coplanar waveguide with said first conductor being the center conductor and said second and third conductors grounded;
   (b) a third region in said semiconductor substrate at said surface and along and electrically contacting said third conductor, said third region doped said first conductivity type; and
   (c) a fourth region in said semiconductor substrate at said surface and along and electrically contacting said first conductor, said fourth region doped said second conductivity type, said third region and said fourth region spaced apart to form a second distributed p-i-n diode.

4. The limiter of claim 3, wherein:
   (a) said semiconductor substrate is made of gallium arsenide; and
   (b) said first conductor connects to the conducting line of a microstrip transmission line.

5. The limiter of claim 3, wherein:
   (a) said first conductor varies in width along the direction of said coplanar waveguide and connects to a first conducting line of a first microstrip transmission line at one end of said coplanar waveguide and connects to a second conducting line of a second microstrip transmission line at the other end of said coplanar waveguide, the width of said first conducting line greater than the width of said second conducting line;
   (b) said second and third conductors are connected to a ground plane on the backside of said substrate; and
   (c) said microstrip transmission line includes said ground plane.

6. The limiter of claim 5, wherein:
   (a) said semiconductor surface is planar except at said first, second, third, and fourth regions, and at each of said regions there is a trench in said substrate.

7. The limiter of claim 3, further comprising:
   (a) a quarter-wave section of transmission line with one end connected to said center conductor of said section of coplanar waveguide; and
   (b) a second section of coplanar waveguide with doped regions below the conductors forming p-i-n diodes and with the center conductor connected to the other end of said quarter-wave section of transmission line.

8. An impedance matching distributed diode limiter, comprising:
   (a) a central conductor on a surface of a semiconductor substrate, said central conductor with one end of width equal to the width of the conducting line of a first transmission line on said surface and with the other end of width equal to the width of the conducting line of a second transmission line on said surface;
   (b) second and third conductors on said surface, said second and third conductors located about said central conductor to form a segment of a coplanar waveguide, said second and third conductors grounded;
   (c) doped regions in said substrate at said surface and along and electrically connected to said central, second and third conductors and separated by undoped regions forming p-i-n diodes between said central and second and between said central and said third conductors.

9. The limiter of claim 8, wherein:
   (a) said semiconductor substrate is gallium arsenide;
   (b) said second and third conductors are grounded by vias to the backside of said substrate; and
   (c) said transmission lines are microstrip transmission lines with ground plane on the backside of said substrate.

* * * * *